United States Patent [19]
Wu

[11] Patent Number: 6,146,949
[45] Date of Patent: Nov. 14, 2000

[54] METHOD OF MANUFACTURING MASK ROM DEVICES WITH SELF-ALIGNED CODING IMPLANT

[75] Inventor: Shye-Lin Wu, Hsinchu, Taiwan

[73] Assignee: Acer Semiconductor Manufacturing Inc., Hsinchu, Taiwan

[21] Appl. No.: 09/104,532

[22] Filed: Jun. 25, 1998

[51] Int. Cl.[7] .............................................. H01L 21/8246
[52] U.S. Cl. ............................................ 438/275; 438/278
[58] Field of Search ...................................... 438/275–278

[56] References Cited

U.S. PATENT DOCUMENTS

| | | |
|---|---|---|
| 5,670,402 | 9/1997 | Sogawa et al. . |
| 5,869,373 | 2/1999 | Wen ........................................ 438/275 |

Primary Examiner—Jey Tsai
Attorney, Agent, or Firm—Harness, Dickey & Pierce, P.L.C.

[57] ABSTRACT

A method for forming mask read-only memories comprises: A gate oxide layer is formed on a semiconductor substrate. A polysilicon layer is formed on the gate oxide layer. Then, a silicon nitride layer is formed on said polysilicon layer. The gate structures are defined by patterning the silicon nitride layer and the polysilicon layer. Subsequently, the silicon oxide spacers are formed on the sidewalls of the gate structures. An ion implantation is performed to form the buried bit lines in said semiconductor substrate between said gate structures. A BPSG layer is formed on said semiconductor substrate. Then, the BPSG layer is polished until the top surface of said gate structures and the silicon nitride layer is removed. A conductive layer is formed along the surfaces of said residual BPSG layer, silicon oxide spacers and polysilicon layer.

20 Claims, 6 Drawing Sheets

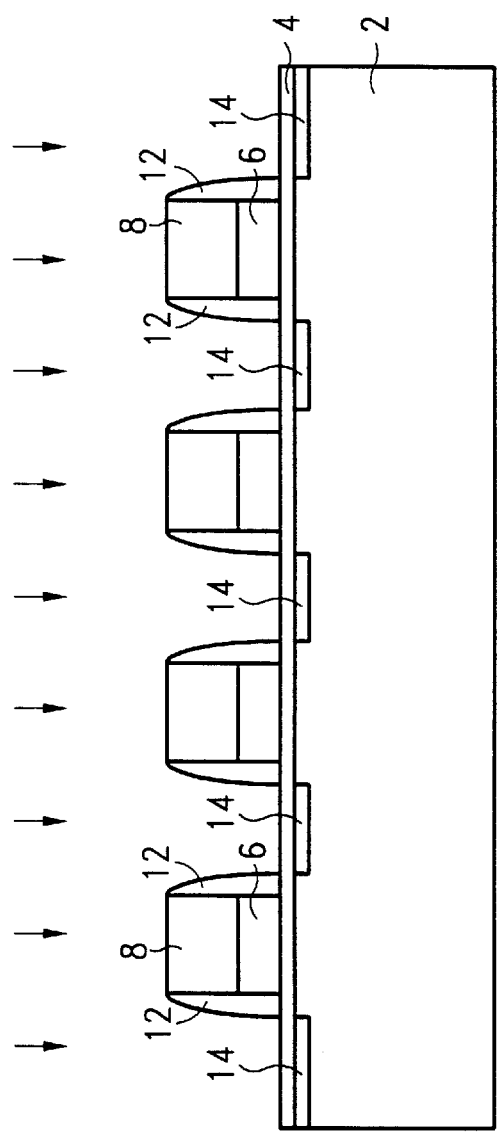

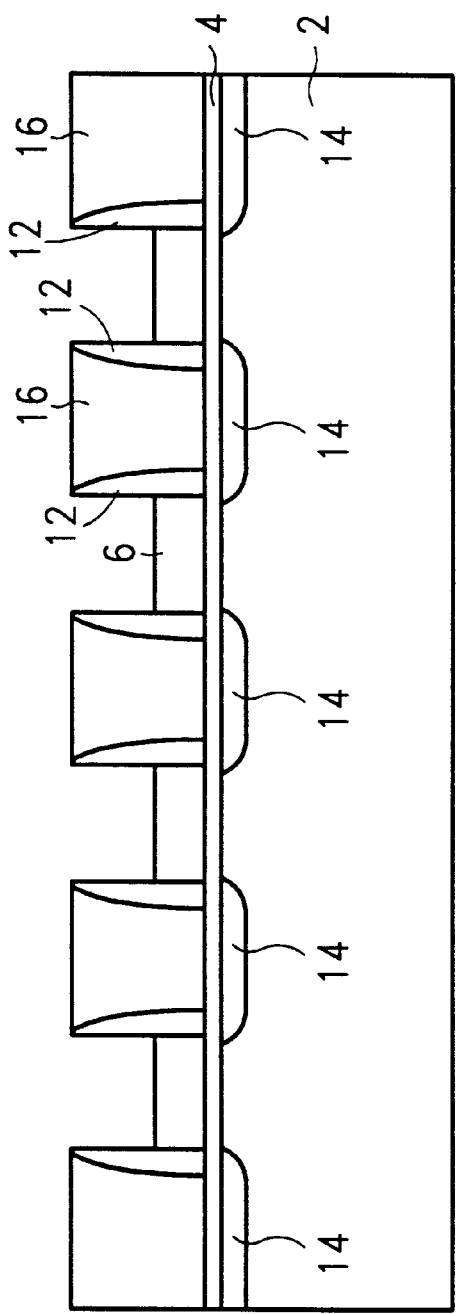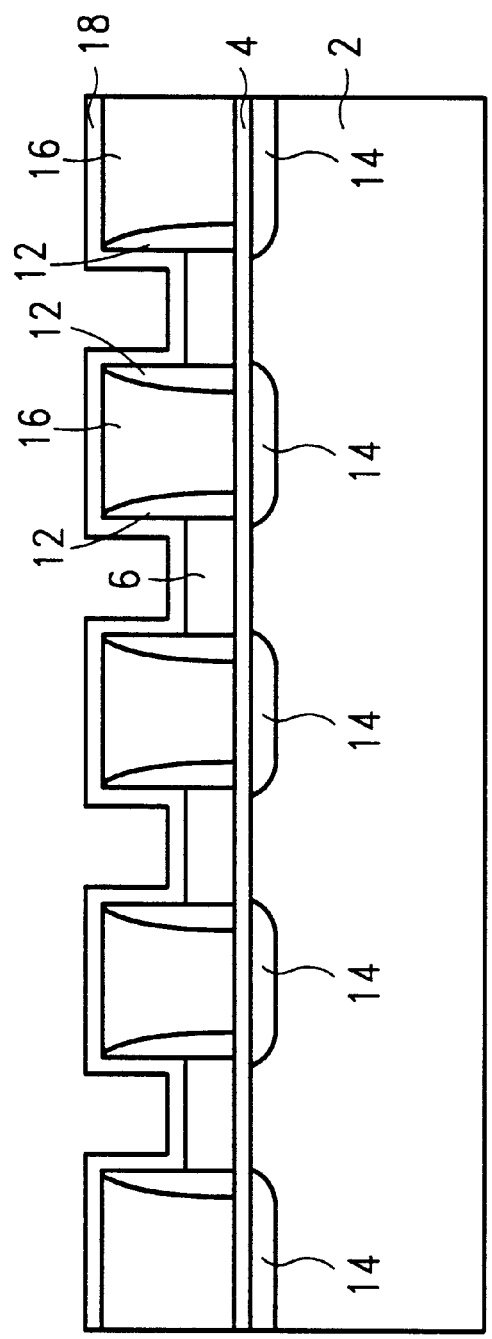

METHOD OF MANUFACTURING MASK ROM DEVICES WITH SELF-ALIGNED CODING IMPLANT

FIELD OF THE INVENTION

The present invention relates to a process for manufacturing a semiconductor device, and more specifically, to a process for manufacturing a mask ROM for semiconductor devices.

BACKGROUND OF THE INVENTION

In recent years, the portable computer and telecommunications market has developed rapidly and has become a major driving force in the design and technology of the semiconductor integrated circuit. It has created a great need of high density and high speed read-only memories for notebook computers, mobile phones, portable CD players and so on. Read-only memories (ROMs), which are non-volatile memories and retain their memory data whenever the power is turned off, have wide applications in the computer and electronic industry. These read-only memories are required for above systems to store permanent programs such as operating systems or applications software instead of conventional mass storage equipment.

Read only memory (ROM) devices comprise ROM cells for coding data and a periphery controlling devices to control the operation of the cells. Each bit of data is stored in a cell, which is a single n-channel transistor or ROM cell. As is well known in the art, the programming of the ROM is executed by controlling a threshold voltage of the MOS transistors constructing the memory cell by the implantation of dopant. There are two types of ROM array referred to as NOR type array and NAND type array for storing data. The NOR type ROM array consists of a set of MOS transistors connected in parallel to bit lines and has high speed operation but low bit density due to the large cell size resulting from the need of a bit line contact to every cell. The NAND type ROM structure, in which MOS transistors connected in series and has only one bit line contact for a series of cells, can be much smaller in area and exhibits higher packing density since there is no contact hole required in each array cell.

In general, mask ROM includes MOS devices with different threshold voltage for programming. Typically, the MOS transistors served as memory cells are designed to operate at the same threshold level and usually "ON" or in a logic "1" state. Some of the cell transistors are then programmed to be "OFF" or in a logic "0" state for data writing by raising their threshold voltage. For fabricating the normally "OFF" cell transistors in accordance with the designed storage circuit, a high-dosage opposite-type ion implantation into the channel regions can be adopted to increase the threshold voltage and therefore change the logic state from "1" to "0". The doped regions are usually referred as coding regions. Alternatively, selective thickening of the gate oxide or selective through-hole contact opening can replace the coding implantation to be the chosen programming method. Furthermore, the data writing can also be achieved by changing the transistors from enhancement mode to depletion mode.

A buried bit line ROM cell is by far the most competitive ROM structure of high density ROM memories because it is contactless and hence the cell size is smaller. However, when the cell dimension shrinks, the buried bit line N+ doping needs to be reduced to avoid the problem of short channel punch through. Low buried bit line resistance is also important because every cell will have a different bit line resistance to metal pick up contact. For example, there will be one contact for every 32 cells. C. C. Hsue et al., in U.S. Pat. No. 5,418,175, proposed a post-metal-programming ROM process for manufacturing ROM cells with high junction breakdown voltage, low junction capacitance and low buried N+ resistance which require higher breakdown voltage and higher speed circuits.

However, referring to U.S. Pat. No. 5,472,898 by G. Hong et al. and U.S. Pat. No. 5,683,925 by Irani et al., the prior art method has another drawback in that it is difficult to locate the pattern precisely on the photoresist for coding implant, that causes a side-diffusion effect and result in a higher bit line resistance. Besides, when the dopant is present in large quantities such that the concentration is in the channel, it causes "band-to-band" tunneling of current from the bit line to the substrate of the transistor. If this leakage current is large enough, it will cause all "0"s on this bit line look as though they were conducting "1"s.

SUMMARY OF THE INVENTION

The present invention provides various advantages. For example, the present invention can make the ROM code implantation into the center part of the channel area accurately for enhancing programming. The present invention can provide a self-aligned coding process to prevent the ROM coding misalignment and the side-diffusion of doped impurities, since the sidewall spacers can guide the impurity implantation more precisely. In addition, the present invention can form high density buried bit line mask ROM cells without the penalty of high junction capacitance, a leakage current and high junction resistance due to the high dose boron implant.

A method for forming mask read-only memories comprises: A gate oxide layer formed on a semiconductor substrate and a polysilicon layer is formed on the gate oxide layer. Then, a silicon nitride layer is formed on the polysilicon layer. The gate structures are defined by patterning the silicon nitride layer and the polysilicon layer. The silicon oxide spacers are formed on the sidewalls of the gate structures.

Subsequently, an ion implantation is performed by using the silicon nitride layer and the silicon oxide spacers as a mask to form the buried bit lines in the semiconductor substrate between the gate structures. A BPSG layer is formed on the semiconductor substrate. Then, the BPSG layer is polished until the top surface of the gate structures by using chemical mechanism polishing(CMP) process, and the silicon nitride layer is removed. A conductive layer is formed along the surfaces of the residual BPSG layer, silicon oxide spacers and polysilicon layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 5 is a cross-sectional view of a semiconductor wafer illustrating the step of performing a N+ buried bit line implantation according to the present invention;

FIG. 6 is a cross-sectional view of a semiconductor wafer illustrating the step of forming a BPSG layer on the gate oxide layer, the oxide spacers and the gate electrode according to the present invention;

FIG. 7 is a cross-sectional view of a semiconductor wafer illustrating the step of etching back the BPSG layer according to the present invention;

FIG. 8 is a cross-sectional view of a semiconductor wafer illustrating the step of forming a N+ poly silicon layer and defining the word lines according to the present invention;

DETAILED DESCRIPTION OF THE PREFERRED EMBODIMENT

The present invention proposes a novel method for fabricating buried bit line mask read-only memories devices with self-aligned coding implant for high speed operation. The method described here includes many process steps that are well-known in the art like photolithography, etching or chemical vapor deposition (CVD), which are not discussed in detail.

Figure 1:
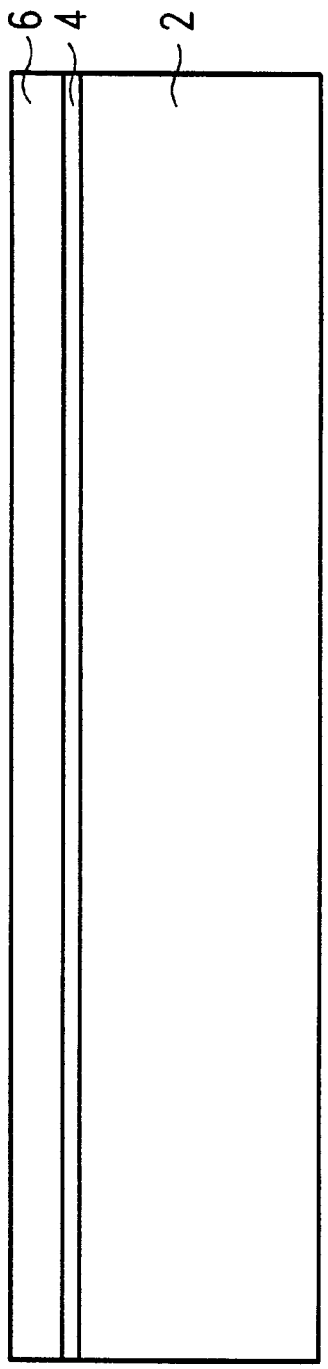
FIG. 1 is a cross-sectional view of a semiconductor wafer illustrating the step of forming a gate oxide layer and a polysilicon layer on the substrate according to the present invention.

Referring to FIG. 1, a single crystal substrate with a <100> crystallographic orientation is used for the preferred embodiment. Isolation regions (not shown in FIGURE) are created for the purposes of isolation. In a case, FOX (field oxide) regions are created to achieve the purpose. Typically, the memory device includes a cell area surrounded by a periphery area consisted by n-channel transistors. The cell area includes a multiplicity of ROM transistors. Therefore, the first step of the present invention is to create transistors on the substrate 2 both in the cell area and in the periphery area. In order to achieve this, gate structures are defined by means of conventional processes. For example, a thin oxide layer 4 is formed on the substrate 2 to act as a gate oxide by using an oxygen-steam ambient, at a temperature between about 800 to 1100 degrees centigrade. Alternatively, the gate oxide 4 may be formed using other known oxide chemical compositions and procedures. In the preferred embodiment, the thickness of the gate oxide layer 4 is about 15–200 angstroms. A polysilicon layer 6 having heavy n type conductive dopant (n+) is deposited by chemical vapor deposition on the gate oxide layer 4.

Figure 2:
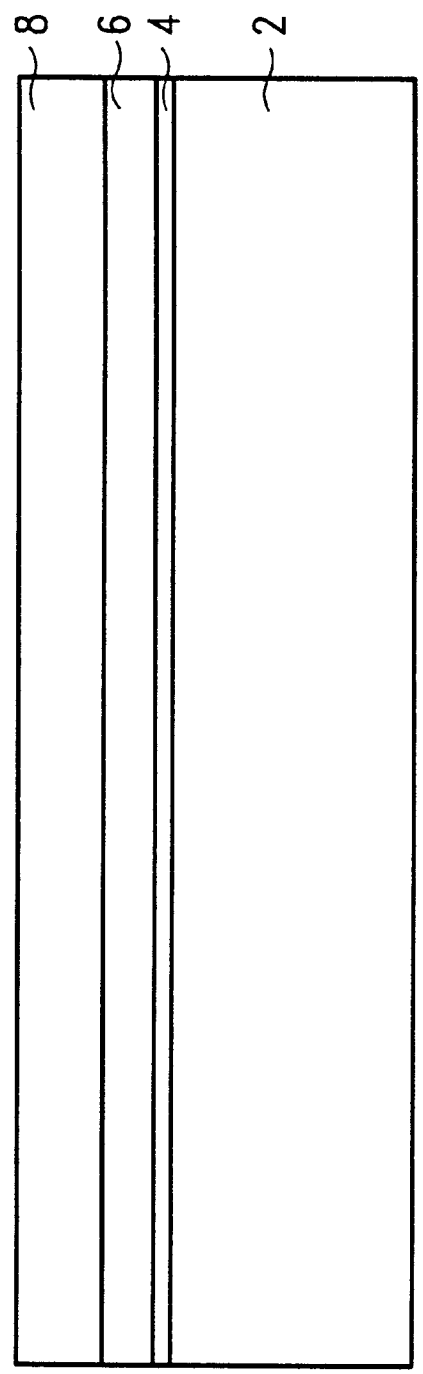
FIG. 2 is a cross-sectional view of a semiconductor wafer illustrating the step of forming a silicon nitride layer on the substrate according to the present invention.

Referring to FIG. 2, a thick silicon nitride layer 8 is deposited on the polysilicon layer 6 to serve as a masking layer for a later implant process. The silicon nitride layer 8 can also serve as an anti-reflective coating (ARC) for subsequent lithography technology to define a narrower polysilicon gate. In general, the silicon nitride layer 8 can be deposited by any suitable process such as Low Pressure Chemical Vapor Deposition (LPCVD), Plasma Enhance Chemical Vapor Deposition (PECVD), Electron Cyclotron Remote Chemical Vapor Deposition (ECRCVD). The thickness of the silicon nitride layer 8 is about 300 to 1000 angstroms. Further, the temperature to form the silicon nitride layer 8 is at a range of 300–800° C. In the preferred embodiment, the reaction gases of the step to form the silicon nitride layer 8 are $SiH_4$, $NH_3$, $N_2$, $N_2O$ or $SiH_2Cl_2$, $NH_3$, $N_2$, $N_2O$.

Figure 3:
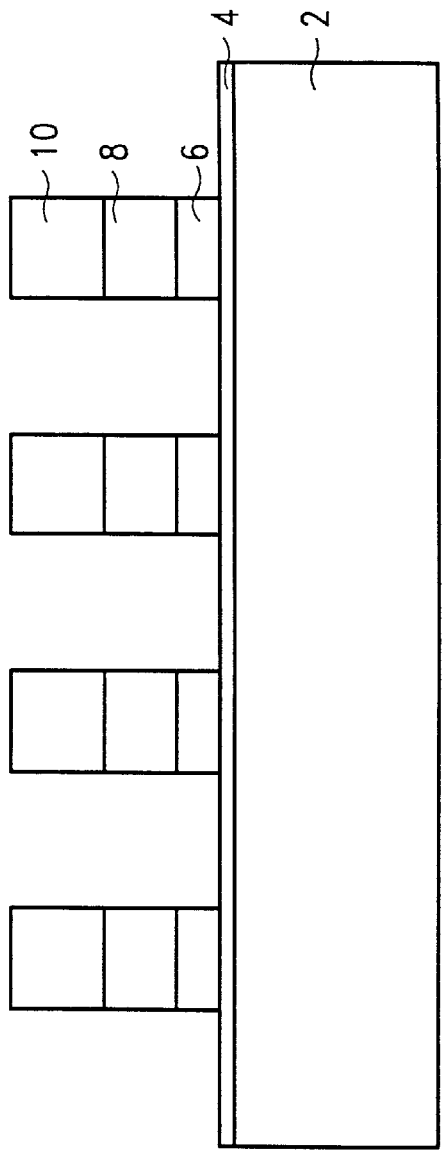
FIG. 3 is a cross-sectional view of a semiconductor wafer illustrating the step of defining the polysilicon gate electrode and buried bit lines according to the present invention.

Turning to FIG. 3, the silicon nitride layer 8 and the polysilicon layer 6 are patterned to define the gates electrodes and the buried bit line areas on the substrate 2 by using a photoresist 10 as an etching mask. The photoresist 10 is formed on the silicon nitride layer 8 by using a standard manner of photolithography including photoresist coating, exposure and development processes. The silicon nitride layer 8, which is used to improve the accuracy of the photoresist exposure, is patterned by a reactive ion etching (RIE) with plasma gases containing fluoride such as $CF_4/O_2$, $CF_2/H_2$, $CHF_3$ or $NF_3$. Another dry etching using $Cl_2$, $BCl_3$, HBr, $SF_6$ or $SiCl_4$ as the plasma source can be employed for polysilicon patterning. Then, the photoresist 10 is stripped by conventional manner.

Figure 4:
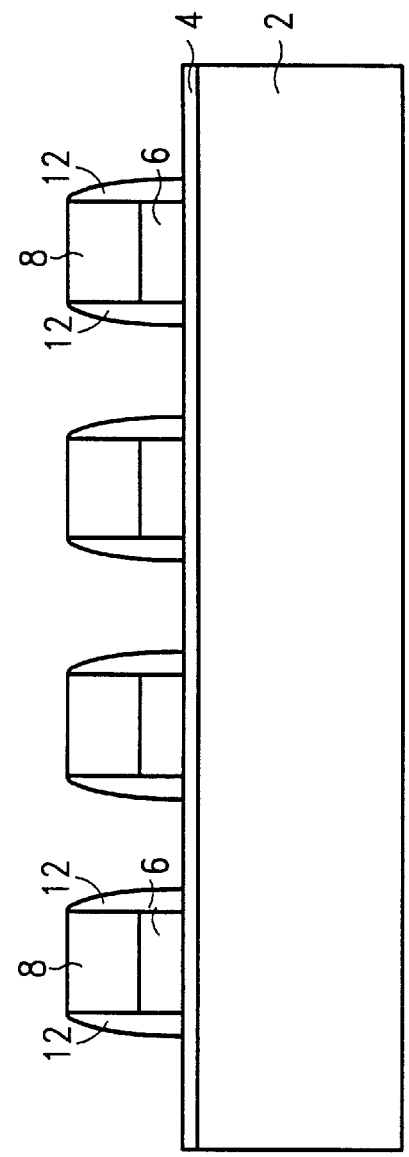
FIG. 4 is a cross-sectional view of a semiconductor wafer illustrating the step of forming oxide spacers on the sidewalls of the gate electrode according to the present invention.

Next, and referring to FIG. 4, silicon dioxide spacers 12 are formed on the side walls of the etched polysilicon layer 6 and silicon nitride layer 8 by means of forming a silicon dioxide layer then etching the layer. Thereafter, oxide spacers 12 are formed by the anisotropically etching. Then, referring to FIG. 5, an ion implantation with n type conductive dopant, such as phosphorus, is carried out to form the source and drain regions to serve as buried bit lines 14 both in the cell area and in the periphery area adjacent to the gate structure. The energy and dosage of the implantation are about 0.5 to 100 KeV, 1E14 to 5E16 atoms/cm$^2$, respectively.

Turning to FIG. 6, a thick BPSG(borophosphosilicate glass) layer 16 is coated on the surface of the nitride layer 8, the oxide spacers 12 and the oxide layer 4 to serve as a sacrificial layer. The BPSG layer 16 with a thickness of from about 4000 angstroms to about 8000 angstroms is formed by the process of LPCVD(Low Pressure CVD) or APCVD(Air Pressure CVD) process at a temperature of from about 300° C. to about 500° C. Then, a high temperature thermal anneal is performed at a temperature of about 800–1100° C. to reflow the BPSG layer 16 for smoothing the surface of the BPSG layer 16. Besides, the thermal anneal is used to activate the dopant, thereby forming buried bit lines profile.

Referring to FIG. 7, a chemical mechanism polishing (CMP) process is performed to etch back the BPSG layer 16 until the top surface of silicon nitride layer 8. (Please refer to FIG. 6.) Then, the silicon nitride layer 8 is completely removed to expose the top surface of the polysilicon layer 6 by using $CF_4/H_2$, $CHF_3$ or $CH_3CHF_2$. Next, The word line regions 18 are now formed on the BPSG layer 16, the oxide spacers 12 and the polysilicon layer 6, as shown in FIG. 8 by the next two steps. First, a conductive film 18 is deposited on the BPSG layer 16, the oxide spacers 12 and the polysilicon layer 6. This conductive layer 18, which will serve as word lines after patterning, is preferably formed of N+ polysilicon or metal silicide like $WSi_2$. In addition, metal material such as titanium (Ti), tungsten (W), cobalt (Co), platinum (Pt) or Nickel (Ni) and so on can be another suitable choice for this conductive layer. The word line pattern is then defined by a photolithography process and an anisotropic etching.

Figure 9:
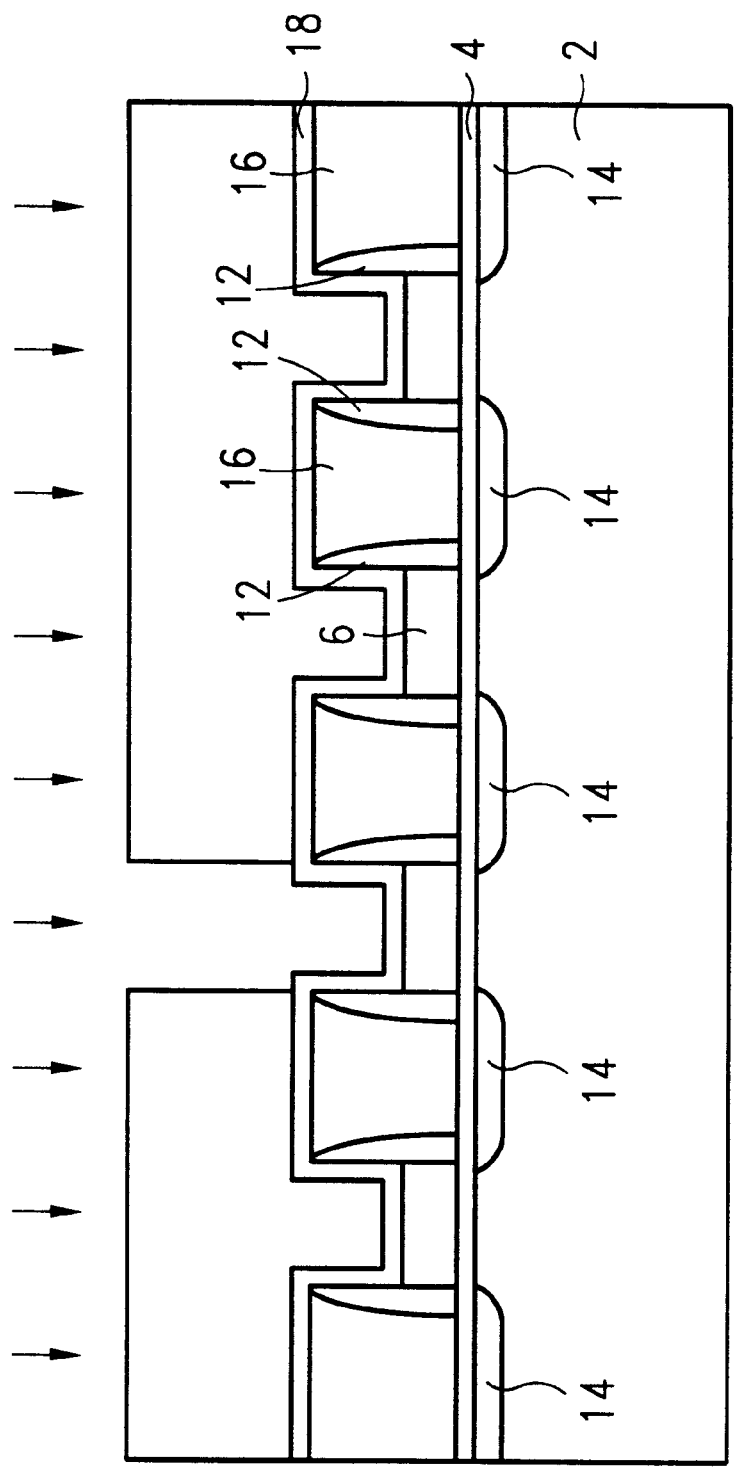
FIG. 9 is a cross-sectional view of a semiconductor wafer illustrating the step of performing a coding implant into silicon substrate according to the present invention.

Thereafter, a coding implantation is carried out to adjust the threshold voltage of the selected coding regions for the designed ROM array. To achieve that, a photoresist 20 is patterned on the conductive layer 18 for defining the coding region 22 by masking on all other areas. A heavy dosage of ion implantation is performed to implant the doping ions into the channel region 22 exposed by the photoresist 20. The conductive type of these doping ions should be opposite to that of the designed channel type and therefore increase the threshold voltage of the coding devices. In general, the channel conductive type is n-type and the doping ions are p-type ions such as boron. The coding cells are forced into an "off" state permanently in the normal operation level. The dose and energy used by this coding implantation are about 5E11 to 1E15 ions/cm$^2$ and 80 to 300 keV respectively. The resulting coding regions 22 and the patterned photoresist 20 are shown in FIG. 9. The arrows indicate the implanting direction.

Figure 10:
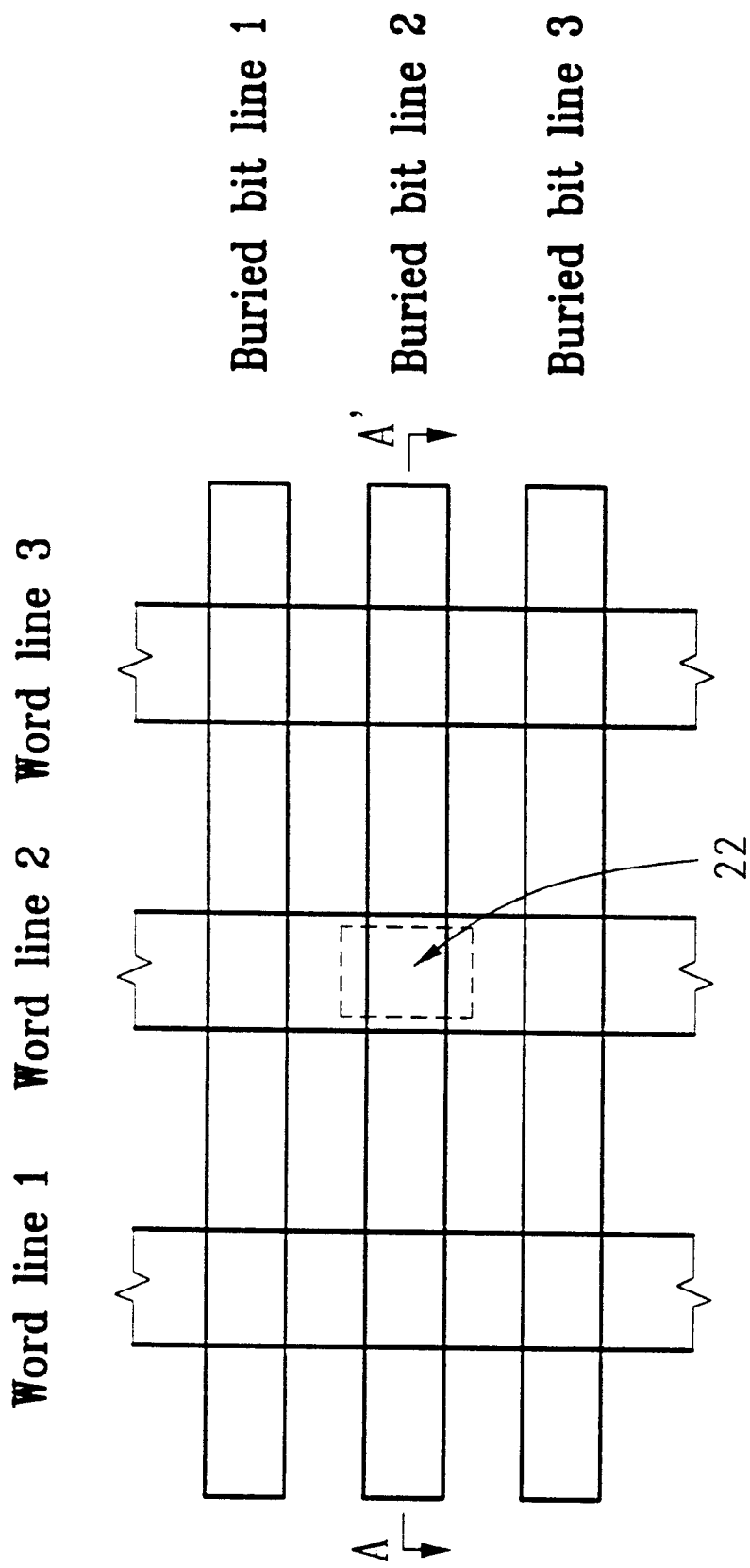
FIG. 10 is a top view of the high-density mask ROM of the present invention.

FIG. 10 is a mask ROM array scheme according to the present invention, which shows the top view of the high density buried bit line mask ROM. FIG. 9 is cross sectional view taken from the A-A' line of FIG. 10. In FIG. 10, a plurality of vertical lines used as word lines (word line 1, word line 2, word line 3, . . . ) are configured over a substrate. The buried bit line (buried bit line 1, buried bit line 2, buried bit line 3, . . . ) are arranged vertical to each word lines. A coding region 22 is formed between two adjacent word lines.

As can be appreciated from the above disclosure, the present invention provides the following advantages: First, the present invention can make the ROM code implantation into the center part of the channel area, which can achieve the goals of enhancing programming (turning the transistor off) and preventing the P+layer from encroaching upon or contacting with the N+source/drain junction. Second, the present invention can provide a self-aligned coding process for a mask ROM that resolves the problem of ROM coding misalignment and the side-diffusion of doped impurities caused thereby, since the sidewall spacers can guide the impurity implantation more precisely. Besides, the present invention can form high density buried bit line mask ROM cells without the penalty of high junction capacitance, a leakage current and high junction resistance due to the high dose boron implant.

As is understood by a person skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method for forming mask read-only memories, said method comprises:

forming a gate oxide layer on a semiconductor substrate;

forming a polysilicon layer on said gate oxide layer;

forming a masking layer on said polysilicon layer;

patterning said masking layer and said polysilicon layer to define gate structures;

forming spacers on sidewalls of said patterned gate structures;

Implanting first conductive type dopant into said semiconductor substrate by using said masking layer and said spacers as a mask to form buried bit lines in said semiconductor substrate between said gate structures;

coating a sacrificial layer on said semiconductor substrate;

removing a portion of said sacrificial layer on a top surface of said gate structures;

removing said masking layer;

forming a conductive layer along a surface of said residual sacrificial layer, spacers and polysilicon layer; and defining word lines by etching said conductive layer.

2. The method according to claim 1 further comprises performing a thermal anneal to reflow said sacrificial layer and to activate said first conductive type dopant in said substrate at a temperature of about 800 to 1100° C. after coating said sacrificial layer.

3. The method according to claim 1, wherein said polysilicon layer is formed of doped polysilicon.

4. The method according to claim 1, wherein said spacers are formed of silicon oxide.

5. The method according to claim 4, wherein said silicon oxide spacers are formed by following steps:

depositing a silicon oxide film on said semiconductor substrate; and etching said silicon oxide film anisotropically.

6. The method according to claim 1 further comprises following steps to form coding regions in said semiconductor substrate:

patterning a photoresist on said semiconductor substrate to define said coding regions by covering all other areas but exposing said coding regions; and implanting second conductive type dopant into said coding regions of said semiconductor substrate.

7. The method according to claim 6, wherein said second conductive type dopant are p-type ions selected from a group consisting of boron ions, and BF$_2$, and said ions are implanted at about 80 to 300 keV with dosage of about 5E11 to 1E15 atoms/cm$^2$.

8. The method according to claim 1, wherein said first conductive type dopant are n-type ions selected from a group consisting of phosphorus ions, arsenic ions and antimony ions, and said ions are implanted at about 0.5 to 100 keV with dosage of about 1E14 to 5E16 atoms/cm$^2$.

9. The method according to claim 1, wherein said conductive layer is formed of a material selected from a group consisting of polysilicon, metal and silicide.

10. The method according to claim 1, wherein said masking layer is formed of silicon nitride layer.

11. The method according to claim 1, wherein said sacrificial layer is formed of borophosphosilicate glass (BPSG).

12. The method according to claim 1, wherein said sacrificial layer is removed by using chemical mechanism polishing(CMP) process.

13. A method for forming buried bit line mask read-only memories, said method comprises:

forming a gate oxide layer on a semiconductor substrate;

forming a polysilicon layer on said gate oxide layer;

forming a silicon nitride layer on said polysilicon layer;

patterning said silicon nitride layer and said polysilicon layer to define gate structures;

forming silicon oxide spacers on sidewalls of said patterned gate structures;

Implanting first conductive type dopant into said semiconductor substrate by using said silicon nitride layer and said silicon oxide spacers as a mask to form buried bit lines in said semiconductor substrate between said gate structures;

coating a borophosphosilicate glass(BPSG) layer on said semiconductor substrate;

removing a portion of said BPSG layer on a top surface of said gate structures by using chemical mechanism polishing(CMP) process;

removing said silicon nitride layer;

forming a conductive layer along a surfaces of said residual BPSG layer, silicon oxide spacers and polysilicon layer; and defining word lines by etching said conductive layer.

14. The method according to claim 13 further comprises performing a thermal anneal to reflow said BPSG layer and to activate said first conductive type dopant in said substrate at a temperature of about 800 to 1100° C. after coating said BPSG layer.

15. The method according to claim 13, wherein said polysilicon layer is formed of doped polysilicon.

16. The method according to claim 13, wherein said silicon oxide spacers are formed by following steps:

depositing a silicon oxide film on said semiconductor substrate; and etching said silicon oxide film anisotropically.

17. The method according to claim 13 further comprises following steps to form coding regions in said semiconductor substrate:

patterning a photoresist on said semiconductor substrate to define said coding regions by covering all other areas but exposing said coding regions; and implanting second conductive type dopant into said coding regions of said semiconductor substrate.

18. The method according to claim 17, wherein said second conductive type dopant are p-type ions selected from a group consisting of boron ions, and $BF_2$, and said ions are implanted at about 80 to 300 keV with dosage of about 5E11 to 1E15 atoms/cm$^2$.

19. The method according to claim 13, wherein said first conductive type dopant are n-type ions selected from a group consisting of phosphorus ions, arsenic ions and antimony ions, and said ions are implanted at about 0.5 to 100 keV with dosage of about 1E14 to 5E16 atoms/cm$^2$.

20. The method according to claim 13, wherein said conductive layer is formed of a material selected from a group consisting of polysilicon, metal and silicide.

* * * * *